United States Patent [19]

Shinomiya

[11] Patent Number: 4,583,050
[45] Date of Patent: Apr. 15, 1986

[54] GAIN CONTROL CIRCUIT
[75] Inventor: Yoshitaka Shinomiya, Soma, Japan
[73] Assignee: Alps Electric Co. Ltd., Japan
[21] Appl. No.: 733,497
[22] Filed: May 10, 1985
[30] Foreign Application Priority Data May 14, 1984 [JP] Japan ............................... 59-69983[U]

[51] Int. Cl.$^4$ ................................................ H03G 3/30
[52] U.S. Cl. ..................................... 330/283; 330/294
[58] Field of Search ..................... 330/86, 94, 95, 283, 330/294

[56] References Cited

U.S. PATENT DOCUMENTS 3,023,369  2/1962  Horowitz ............................ 330/283
4,019,160  4/1977  Kam .................................. 333/81 R
4,255,716  3/1981  Takada ............................... 330/284

Primary Examiner—James B. Mullins
Attorney, Agent, or Firm—Guy W. Shoup

[57] ABSTRACT

Disclosed is a gain circuit which comprises a transistor for amplifying a high-frequency signal, a variable impedance element connected with an emitter of the transistor and having an impedance variable in accordance with an amount of current flowing therethrough, a control circuit for controlling the amount of current flowing through the variable impedance element, a series circuit composed of a coil and a resistor connected in series with each other, and another resistor connected between the series circuit and a power supply terminal, the variable impedance element and the series circuit being connected in parallel with each other.

3 Claims, 7 Drawing Figures

GAIN CONTROL CIRCUIT

BACKGROUND OF THE INVENTION

1. Field of the Invention

The present invention relates to a gain control circuit and particularly to a gain control circuit in a wide frequency band high-frequency amplifying circuit in which the amount of gain control can be made even over the whole frequency band with less non-linear distortion.

2. Description of Prior Art

FIG. 1 shows the conventional gain control circuit which comprises an input terminal 1, a transistor 2 for amplifying a high-frequency signal $f_o$ from the input terminal 1, and a variable impedance element 3 such as a PIN diode with one end connected with the emitter of the transistor 2 and the other end is grounded through a capacitor 4. In view of equivalence, the variable impedance circuit 3 is such that an internal resistor 3a and an internal capacitor 3b are connected in parallel with each other and the resistance value of the internal resistor 3a is varied in accordance with the amount of current i1 flowing thereinto to thereby change the impedance. The gain control circuit further comprises another transistor 5 for controlling the amount of current flowing in the variable impedance element 3, an output terminal 13 connected with the collector of the transistor 2, an input terminal 14 for receiving a gain control voltage which is applied to the base of the transistor 5 through a resistor 11 to control the base voltage which in turn controls the collector current so that the current flowing into the impedance element 3 is controlled, a power supply terminal to which a negative voltage is applied, resistors 6 to 10, and a coil 12.

The operation of the thus arranged gain control circuit will be described hereunder. The high-frequency signal $f_o$ applied to the input terminal is fed to the base of the transistor 2, amplified therein by means of amplifying function thereof, and produced to the next stage (not shown) through the output terminal 13. At this time, the emitter current i1 flows also through the transistor 5 and the collector current of the transistor 5 is controlled by the base voltage applied from the input terminal of the transistor 5. The variable impedance element 3, such as a PIN diode, is arranged such that the resistance value of the internal resistor 3a is varied in accordance with the amount of current flowing thereinto so that the collector current of the transistor 5 is controlled by controlling the base voltage thereof to control the amount of current flowing in the variable impedance element 3 to thereby vary the resistance value of the internal resistor 3a. As the amount of current flowing in the variable impedance element 3 increases, the resistance value of the internal resistor 3a and therefore the impedance of the variable impedance element 3 becomes low to increase the collector current of the transistor 2 to thereby make the signal amplifying gain of the transistor 2 high. The reverse applies the case where the resistance value of the internal resistor value 3a is made high, whereby the signal amplifying gain can be controlled.

In the thus arranged gain control circuit, for example, if it is desired to lower the gain, the base voltage of the transistor 5 applied from the input terminal 14 is lowered to decrease the collector current of the transistor 5. Thus, the amount of current flowing in the variable impedance element 3 which is equal to the collector current of the transistor 5 also decreases. As the amount of current of the variable impedance element 3 decreases, the impedance for the high-frequency signal $f_o$ increases correspondingly (see FIG. 3) and current negative feedback is applied to the transistor 2 due to the emitter impedance thereof so that the gain is lowered as shown in FIG. 4. In the case the current flowing in the variable impedance element 3 takes a minimum value, the gain of the transistor 2 becomes minimum (the amount of attenuation is the largest).

In the thus arranged gain control circuit as described above, however, the impedance (Z) of the variable impedance element 3 takes a different value depending on the frequency $f_o$ of the high-frequency signal as shown in FIG. 3 even if the amount of current flowing in the variable impedance element 3 is constant (for example $I_D = I_f$), so that the respective amounts of gain control G1 and G2 are different from each other ($G_1 > G_2$) between high-frequency signals $f_1$ and $f_2$ ($f_1 > f_2$) in the high and low frequency bands respectively as shown in FIG. 4, resulting in variations in amount of attenuation depending on the frequency of the high-frequency signal $f_o$.

If the base voltage of the transistor 5 is lowered to lower the gain, the emitter current of the transistor 2 is caused to decrease, resulting in a change in the operating point of the transistor 2 to enlarge the non-linear distortion. Thus, the distortion characteristic of the amplifying circuit with the transistor 2 as its amplifying element is deteriorated.

Further, in the case where the operating point of the amplifying transistor 2 shifts due to the reduction in the emitter current thereof, the level of the high-frequency signal applied to the base of the transistor 2 is large as it was before the operating point has been shifted so that the high-frequency signal of such a large signal level can not be sufficiently amplified by the transistor 2 the emitter current of which has been decreased and this fact also may be a cause of deterioration in non-linear distortion characteristic.

SUMMARY OF THE INVENTION

Accordingly, an object of the present invention is to eliminate the above-mentioned drawbacks in the prior art gain control circuit.

Another object of the present invention is to provide a gain control circuit in a wide frequency band high-frequency amplifying circuit, in which the amount of gain control can be made even over the whole frequency band with less non-linear distortion.

According to an aspect of the present invention, the gain control circuit is featured in that the circuit comprises a transistor for amplifying a high-frequency signal, a variable impedance element connected with an emitter of the transistor and having an impedance variable in accordance with an amount of current flowing therethrough, a control circuit for controlling the amount of current flowing through the variable impedance element, a series circuit composed of a coil and a resistor connected in series with each other, and another resistor connected between the series circuit and a power supply terminal, the variable impedance element and the series circuit being connected in parallel with each other.

Another objects, features and advantages of the present invention will be apparent when read the following

DESCRIPTION OF PREFERRED EMBODIMENTS

Figure 1:
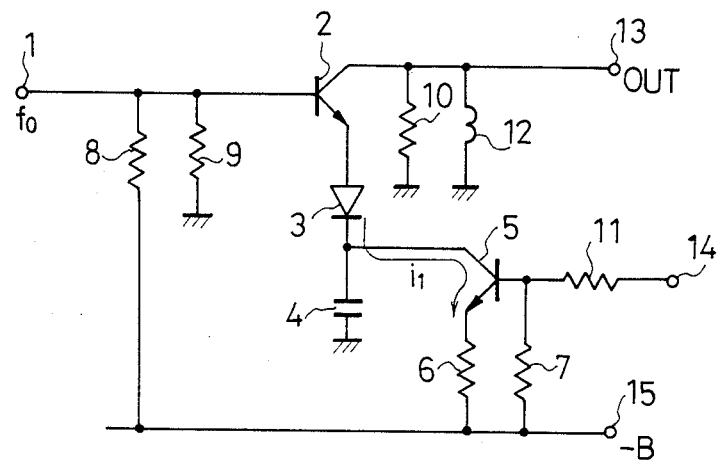
FIG. 1 is a diagram showing the conventional gain control circuit.
Figure 2:
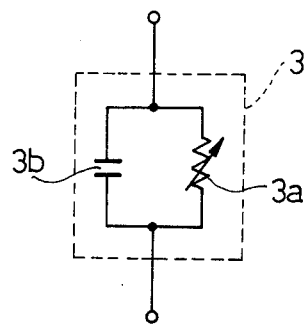
FIG. 2 is an equivalent circuit diagram of the variable impedance element.
Figure 3:
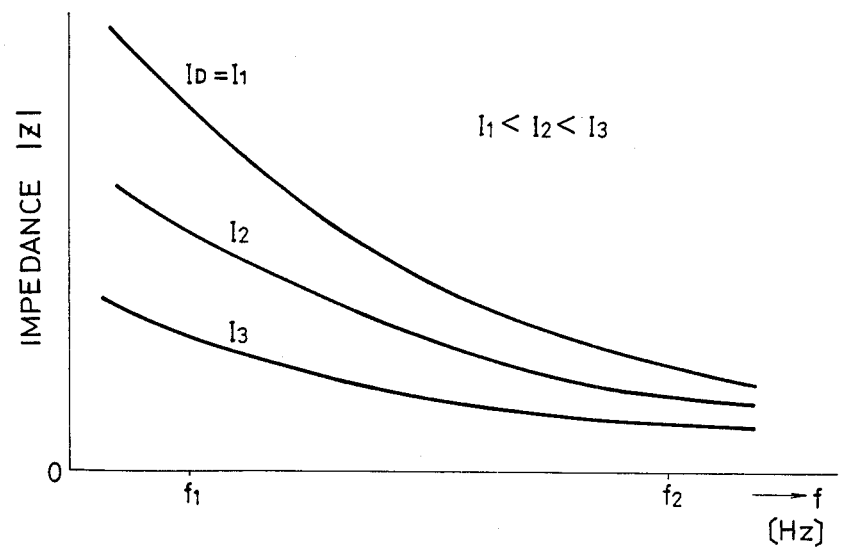
FIGS. 3 and 4 are diagrams for explaining operations.
Figure 4:
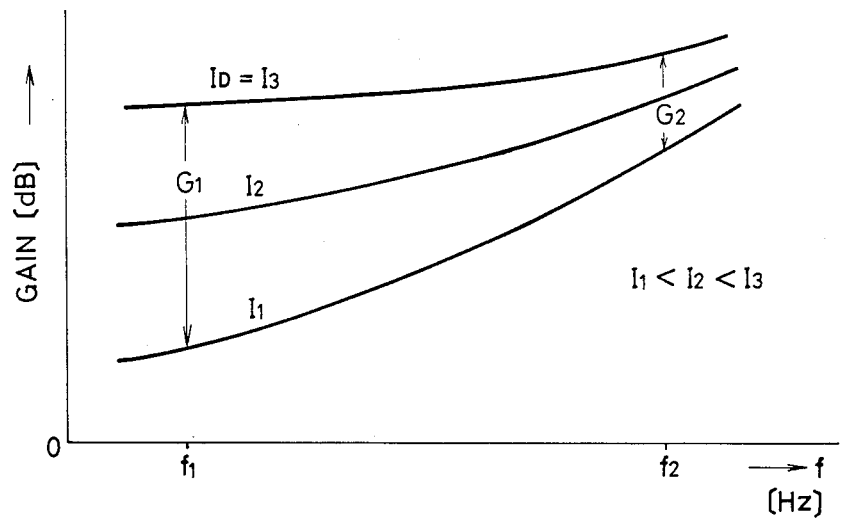
Figure 5:
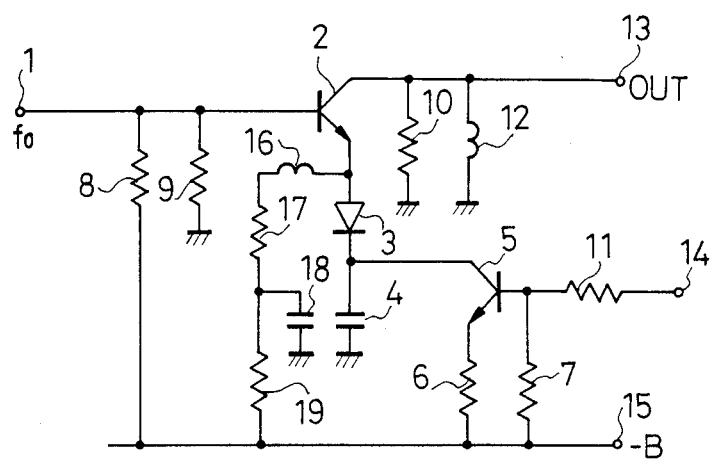
FIG. 5 is a diagram showing an embodiment of the gain control circuit according to the present invention.
Figure 6:
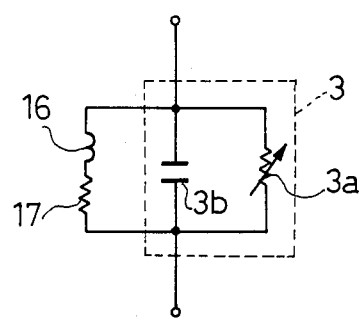
FIG. 6 is an equivalent circuit diagram of the variable impedance element and the series circuit.
Figure 7:
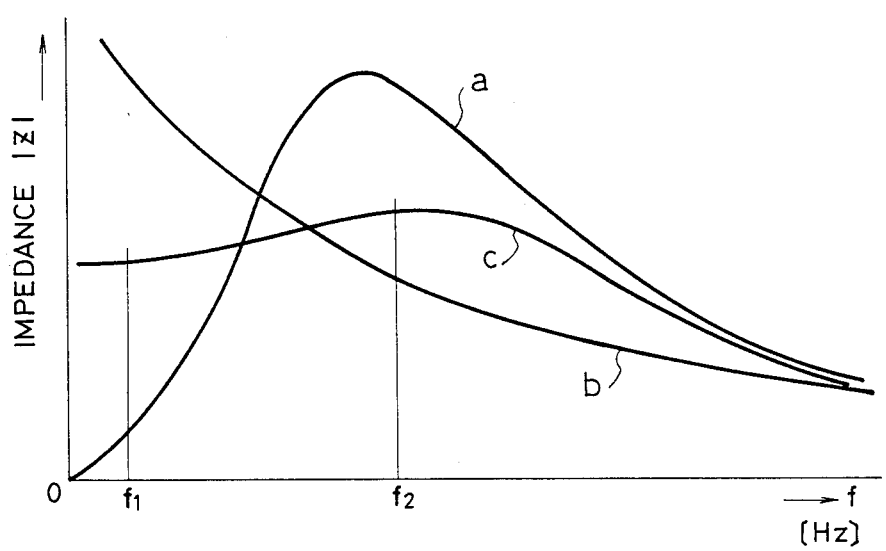
FIG. 7 is a characteristic diagram for explaining operations.

Referring to FIGS. 5 to 7, a preferred embodiment of the present invention will be described hereunder. In these drawings, the same part as in the conventional gain control circuit is designated by the same reference numeral as used in the latter and the description thereof is omitted here.

In the drawings, the gain control circuit comprises a coil 16 with its one end connected with the connection point between the emitter of a transistor 2 and a variable impedance element 3, a resistor 17, a DC blocking capacitor 18 having a relatively large capacitance, and a resistor 19, the coil 16, the resistor 17 and the capacitor 18 being connected in series, the capacitor 18 having its one end grounded, the series connection of the coil 16, the resistor 17 and the capacitor 18 being connected in parallel with the series connection of the variable impedance element 3 and a capacitor 4. The resistor 19 is connected between a power supply terminal 15 and the other end of the capacitor 17.

The operation of the thus arranged gain control circuit will be described hereunder. FIG. 6 is a diagram of an equivalent circuit for a high-frequency signal of the circuit composed of the parallel connection of the coil 16, the resistor 17 and the capacitor 18 and the series connection of the variable impedance element 3 and the capacitor 4. The variable impedance element 3 can be illustrated by an equivalent circuit composed of an internal resistor 3a and an internal capacitor 3b. In the equivalent circuit as shown in FIG. 6, the impedance (Z) is as shown by a curve a in FIG. 7 in the state that the coil 16 is connected in parallel with the variable impedance element 3, while the impedance (Z) is as shown by a curve b in FIG. 7 when the resistor 17 and the variable impedance element 3 are connected with each other. The curve a has a peak at a predetermined frequency because the parallel connection of the coil 16 and the variable impedance element 3 constitutes an LC resonance circuit composed of the coil 16 and the internal capacitor 3b, while the curve b is attenuated depending on the frequency because an RC parallel circuit is constituted. Accordingly, substantially flat impedance (Z) can be obtained as shown by a curve c in FIG. 7 by selecting the coil 16 and the resistor 17 to have a proper inductance value and a proper resistance value respectively.

Further, since the resistor 19 is disposed between the power supply line and the series connection of the coil 16 and the resistor 17, a part of the emitter current of the transistor 2 is bypassed through the resistors 17 and 19. Thus, even if the amount of current flowing through the variable impedance element 3 is decreased due to the gain control voltage applied to the input terminal 14 to a value which changes the bias of the amplifying transistor 2, the operation point of the amplifying transistor 2 can be maintained at a position of less non-linear distortion because a predetermined amount of emitter current flows in the transistor 2 through the resistors 17 and 19.

As described above, according to the present invention, a series circuit of a coil and a resistor is connected in parallel with a variable impedance element so that the composite impedance for a high-frequency signal of the above-mentioned parallel connection of the series circuit and the variable impedance element is made even in a given frequency band in gain controlling and therefore the amount of gain control in the frequency band in which gain be controlled can be prevented from being affected by the frequency of high-frequency signals. Thus, the amount of control (the amount of attenuation) can be made even so that stable gain control can be attained.

Further, in the gain control circuit according to the present invention, a part of the emitter current of a transistor which serves as an amplifying element flows by a predetermined amount through a resistor connected between a series circuit and a power supply terminal, and the operation point of the transistor can be maintained at a position where non-linear distortion is less even if the current flowing in the variable impedance element decreases in the gain control operation.

What is claimed is:

1. A gain control circuit comprising:
a transistor for amplifying a high-frequency signal;
a variable impedance element connected with an emitter of said transistor and having an impedance variable in accordance with an amount of current flowing therethrough;
a control circuit for controlling the amount of current flowing through said variable impedance element;
a series circuit composed of a coil and a first resistor connected in series with each other;
a second resistor connected between said series circuit and a power supply terminal; and
said variable impedance element and said series circuit being connected in parallel with each other.

2. A gain control circuit according to claim 1, in which said coil constitutes an LC resonance circuit with an internal capacitance of said variable impedance element and said first resistor constitutes an RC parallel circuit with an internal capacitance of said variable impedance element to thereby obtain a substantially flat impedance characteristic.

3. A gain control circuit according to claim 1, in which said variable impedance element is a PIN diode.

* * * * *